US011846885B2

(12) United States Patent
Liu et al.

(10) Patent No.: US 11,846,885 B2
(45) Date of Patent: Dec. 19, 2023

(54) TOPCOAT COMPOSITIONS AND PHOTOLITHOGRAPHIC METHODS

(71) Applicant: Rohm and Haas Electronic Materials LLC, Marlborough, MA (US)

(72) Inventors: Cong Liu, Shrewsbury, MA (US); Doris H. Kang, Shrewsbury, MA (US); Deyan Wang, Hudson, MA (US); Cheng-Bai Xu, Southboro, MA (US); Mingqi Li, Marlborough, MA (US); Chunyi Wu, Shrewsbury, MA (US)

(73) Assignee: ROHM AND HAAS ELECTRONIC MATERIALS, LLC, Marlborough, MA (US)

( * ) Notice: Subject to any disclaimer, the term of this patent is extended or adjusted under 35 U.S.C. 154(b) by 0 days.

(21) Appl. No.: 14/577,473

(22) Filed: Dec. 19, 2014

(65) Prior Publication Data
US 2015/0323869 A1    Nov. 12, 2015

Related U.S. Application Data

(60) Provisional application No. 61/921,899, filed on Dec. 30, 2013.

(51) Int. Cl.
| | |
|---|---|
| *G03F 7/20* | (2006.01) |
| *G03F 7/11* | (2006.01) |
| *G03F 7/16* | (2006.01) |
| *G03F 7/32* | (2006.01) |
| *C09D 201/00* | (2006.01) |
| *C09D 201/02* | (2006.01) |
| *C08F 220/10* | (2006.01) |
| *C09D 7/20* | (2018.01) |
| *C08L 101/12* | (2006.01) |
| *C09D 133/14* | (2006.01) |
| *C09D 133/16* | (2006.01) |
| *H01L 21/027* | (2006.01) |
| *C08K 5/101* | (2006.01) |
| *C08K 5/05* | (2006.01) |

(52) U.S. Cl.
CPC .......... *G03F 7/2041* (2013.01); *C08F 220/10* (2013.01); *C08L 101/12* (2013.01); *C09D 7/20* (2018.01); *C09D 133/14* (2013.01); *C09D 201/00* (2013.01); *C09D 201/02* (2013.01); *G03F 7/11* (2013.01); *G03F 7/16* (2013.01); *G03F 7/20* (2013.01); *G03F 7/32* (2013.01); *C08K 5/05* (2013.01); *C08K 5/101* (2013.01); *C09D 133/16* (2013.01); *H01L 21/0271* (2013.01)

(58) Field of Classification Search
CPC ........ G03F 7/11; G03F 7/2041; G03F 7/0046; G03F 7/0752; G03F 7/092; C09D 133/16
USPC ... 430/270.1, 271.1, 272.1, 273.1, 322, 325; 528/401, 10
See application file for complete search history.

(56) References Cited

U.S. PATENT DOCUMENTS

| | | | | |
|---|---|---|---|---|
| 5,213,185 A | * | 5/1993 | Flotow | F16D 13/757 192/111.7 |
| 7,666,572 B2 | * | 2/2010 | Harada | C08F 20/18 430/270.1 |
| 7,705,189 B2 | * | 4/2010 | Nishikubo | C07C 13/70 568/632 |
| 7,745,104 B2 | * | 6/2010 | Hatakeyama | G03F 7/091 216/47 |
| 7,955,778 B2 | | 6/2011 | Gallagher et al. | |
| 8,012,666 B2 | | 9/2011 | Gallagher et al. | |
| 8,288,073 B2 | * | 10/2012 | Konno | G03F 7/091 430/270.1 |
| 2007/0212646 A1 | | 9/2007 | Gallagher et al. | |
| 2009/0061360 A1 | * | 3/2009 | Takebe | G03F 7/2041 430/311 |
| 2009/0136878 A1 | * | 5/2009 | Kanna | C08L 33/26 430/325 |
| 2009/0286087 A1 | * | 11/2009 | Tanaka | C08G 59/4042 428/418 |
| 2010/0183976 A1 | | 7/2010 | Wang et al. | |
| 2011/0123925 A1 | * | 5/2011 | Yun | C08F 220/18 430/270.1 |
| 2011/0302979 A1 | * | 12/2011 | Oppenheimer | B21J 3/00 72/42 |

(Continued)

FOREIGN PATENT DOCUMENTS

JP    2007-241053 A  *  9/2007  ................ G03F 7/11

OTHER PUBLICATIONS

Machine translation of JP 2007-241053 (no date).*

(Continued)

*Primary Examiner* — Amanda C. Walke
(74) *Attorney, Agent, or Firm* — CANTOR COLBURN LLP

(57) ABSTRACT

Topcoat compositions are provided that can be used in immersion lithography to form photoresist patterns. The topcoat compositions include a solvent system that comprises 1) a first organic solvent represented by formula (I),

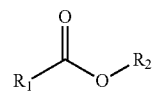

(I)

wherein R1 and R2 are alkyl groups of 3-8 carbons and the total number of carbons of R1 and R2 is greater than 6; and 2) a second organic solvent that is a C4 to C10 monovalent alcohol.

4 Claims, No Drawings

(56) References Cited

U.S. PATENT DOCUMENTS

| | | | | |
|---|---|---|---|---|
| 2012/0077126 A1* | 3/2012 | Mori | ..................... | C07C 69/653 |
| | | | | 430/285.1 |
| 2012/0264053 A1 | 10/2012 | Wang | | |
| 2013/0004894 A1* | 1/2013 | Hayashi | .................... | G03F 7/11 |
| | | | | 430/281.1 |
| 2013/0115553 A1 | 5/2013 | Wang | | |
| 2013/0171574 A1 | 7/2013 | Xu | | |
| 2013/0244180 A1* | 9/2013 | Bae | ........................ | G03F 7/004 |
| | | | | 430/285.1 |
| 2015/0008211 A1* | 1/2015 | Takano | ................... | G03F 7/039 |
| | | | | 216/11 |
| 2015/0159038 A1* | 6/2015 | Bae | ........................ | G03F 7/004 |
| | | | | 430/319 |
| 2015/0185607 A1* | 7/2015 | Park | ........................ | G03F 7/038 |
| | | | | 430/270.1 |

OTHER PUBLICATIONS

English Language Translation of Office Action dated Oct. 28, 2016, issued in counterpart Taiwan Application No. 103145678 (3 pages).
English Language Translation of Office Action issued in counterpart Chinese Application No. 201410858474.X, dated Apr. 18, 2017 (3 pages).
English Language Translation of Search Report dated Mar. 27, 2017, issued in counterpart Chinese Application No. 201410858474.X (2 pages).

* cited by examiner

TOPCOAT COMPOSITIONS AND PHOTOLITHOGRAPHIC METHODS

This application claims the benefit of priority under 35 U.S.C. § 119(e) to U.S. Provisional Application 61/921,899, filed Dec. 30, 2013, the entire contents of which application are incorporated herein by reference.

FIELD

This invention relates to topcoat compositions that may be applied above a photoresist composition in an immersion lithography process. The invention further relates to immersion lithography methods using the topcoat compositions. The invention finds particular applicability in the semiconductor manufacturing industry for forming semiconductor devices.

INTRODUCTION

Photoresists are photosensitive films used for transfer of an image to a substrate. A coating layer of a photoresist is formed on a substrate and the photoresist layer is then exposed through a photomask to a source of activating radiation. The photomask has areas that are opaque to the activating radiation and other areas that are transparent to the activating radiation. Exposure to activating radiation provides a photoinduced chemical transformation of the photoresist coating to thereby transfer the pattern of the photomask to the photoresist coated substrate. Following exposure, the photoresist is baked and then developed by contact with a developer solution to provide a relief image that permits selective processing of the substrate.

One approach to achieving nanometer (nm)-scale feature sizes in semiconductor devices is to use shorter wavelengths of light. However, the difficulty in finding materials that are transparent below 193 nm has led to the immersion lithography process to increase the numerical aperture of the lens by use of a liquid to focus more light into the film. Immersion lithography employs a relatively high refractive index fluid between the last surface of an imaging device (e.g., KrF or ArF light source) and the first surface on the substrate, for example, a semiconductor wafer.

In immersion lithography, direct contact between the immersion fluid and photoresist layer can result in leaching of components of the photoresist into the immersion fluid. This leaching can cause contamination of the optical lens and bring about a change in the effective refractive index and transmission properties of the immersion fluid. In an effort to ameliorate this problem, use of a topcoat layer over the photoresist layer as a barrier between the immersion fluid and underlying photoresist layer has been proposed. The use of topcoat layers in immersion lithography, however, presents various challenges. Topcoat layers can affect, for example, the process window, critical dimension (CD) variation and resist profile depending on characteristics such as topcoat refractive index, thickness, acidity, chemical interaction with the resist and soaking time. In addition, use of a topcoat layer can negatively impact device yield due, for example, to micro-bridging defects which prevent proper resist pattern formation.

To improve performance of topcoat materials, the use of self-segregating topcoat compositions to form a graded topcoat layer has been proposed, for example, in *Self-segregating Materials for Immersion Lithography*, Daniel P. Sanders et al., Advances in Resist Materials and Processing Technology XXV, Proceedings of the SPIE, Vol. 6923, pp. 692309-1-692309-12 (2008). A self-segregated topcoat would theoretically allow for a tailored material having desired properties at both the immersion fluid and photoresist interfaces, for example, an improved water receding contact angle at the immersion fluid interface and good developer solubility at the photoresist interface.

Topcoats exhibiting a low receding contact angle for a given scan speed can result in water mark defects. These defects are generated when water droplets are left behind as the exposure head moves across the wafer. As a result, resist sensitivity becomes altered due to leaching of resist components into the water droplets, and water can permeate into the underlying resist. Topcoats having high receding contact angles would therefore be desired to allow for operation of immersion scanners at greater scan speeds, thereby allowing for increased process throughput. U.S. Patent App. Pub. Nos. 2007/0212646A1 to Gallagher et al. and 2010/0183976A1 to Wang et al. describe immersion topcoat compositions that include a self-segregating surface active polymer which allow for improved water receding contact angles. With the desire for increasingly faster scan speeds on the exposure tool to allow for increased throughput, topcoat compositions having further improved receding contact angles are desired.

There is a continuing need in the art for topcoat compositions exhibiting high receding contact angles for use in immersion lithography, and for photolithographic methods making use of such materials.

SUMMARY

In accordance with a first aspect of the application, provided are new topcoat compositions for use in immersion photolithography.

The present topcoat compositions comprise a polymer system and a solvent system.

In preferred aspects, the polymer system comprises a matrix polymer and a surface active polymer, wherein the matrix polymer is present in the composition in a larger proportion by weight than the surface active polymer, and wherein the surface active polymer has a lower surface energy than a surface energy of the matrix polymer. The solvent system comprises:

1) a first organic solvent a first organic solvent represented by formula (I),

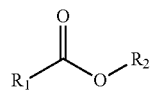

wherein R1 and R2 are alkyl groups of 3-8 carbons and the total number of carbons of R1 and R2 is greater than 6; and 2) a second organic solvent that is a C4 to C10 monovalent alcohol.

In accordance with a further aspect of the invention, provided are coated substrates. The coated substrates comprise a photoresist layer over a substrate, and a layer of a topcoat composition as described herein over the photoresist layer.

In accordance with a further aspect of the invention, provided are methods of forming a photolithographic pattern. The methods comprise: (a) applying a photoresist layer over a substrate; (b) applying over the photoresist composition layer a layer of a topcoat composition as described herein; (c) exposing the photoresist layer to actinic radiation; and (d) contacting the exposed photoresist layer with a developer to form a photoresist pattern.

Other aspects of the invention are disclosed infra.

DETAILED DESCRIPTION

Topcoat Compositions

The topcoat compositions of the invention comprise a polymer system and a solvent system. The polymer system preferably comprises a matrix polymer and a surface active polymer, and may further comprise one or more additional polymers. The surface active polymer should have a lower surface energy than other polymers in the polymer system. As discussed, the solvent system comprises 1) a first organic solvent a first organic solvent represented by formula (I),

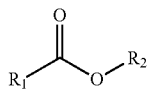
(I)

wherein R1 and R2 are alkyl groups of 3-8 carbons and the total number of carbons of R1 and R2 is greater than 6; and 2) a second organic solvent that is a C4 to C10 monovalent alcohol.

Topcoat compositions of the invention that are applied above a photoresist layer are self-segregating, and can minimize or prevent migration of components of the photoresist layer into an immersion fluid employed in an immersion lithography process. As used herein, the term "immersion fluid" means a fluid, typically water, interposed between a lens of an exposure tool and a photoresist coated substrate to conduct immersion lithography.

Also as used herein, a topcoat layer will be considered as inhibiting the migration of photoresist material into an immersion fluid if a decreased amount of acid or organic material is detected in the immersion fluid upon use of the topcoat composition relative to the same photoresist system that is processed in the same manner, but in the absence of the topcoat composition layer. Detection of photoresist material in the immersion fluid can be conducted through mass spectroscopy analysis of the immersion fluid before exposure to the photoresist (with and without the overcoated topcoat composition layer) and then after lithographic processing of the photoresist layer (with and without the overcoated topcoat composition layer) with exposure through the immersion fluid. Preferably, the topcoat composition provides at least a 10 percent reduction in photoresist material (e.g., acid or organics as detected by mass spectroscopy) residing in the immersion fluid relative to the same photoresist that does not employ any topcoat layer (i.e., the immersion fluid directly contacts the photoresist layer), more preferably the topcoat composition provides at least a 20, 50, or 100 percent reduction in photoresist material residing in the immersion fluid relative to the same photoresist that does not employ a topcoat layer.

Topcoat compositions of the invention can allow for improvement in one or more of various water contact angle characteristics that are important in an immersion lithography process, for example, static contact angle, receding contact angle, advancing contact angle and sliding angle at the immersion fluid interface. The topcoat layer compositions provide topcoat layers having excellent developer solubility for both exposed and unexposed regions of the layer, for example, in an aqueous base developer.

The compositions of the invention can be used with a variety of imaging wavelengths, for example, radiation having a wavelength of less than 300 nm such as 248 nm, 193 nm and EUV wavelengths such as 13.5 nm.

The topcoat compositions of the invention include two or more, preferably three or more, different polymers. Polymers useful in the invention may be homopolymers, but more typically include a plurality of distinct repeat units, with two or three distinct units, i.e., copolymers or terpolymers, being typical. The polymers are aqueous alkali soluble such that a topcoat layer formed from the composition can be removed in the resist development step using an aqueous alkaline developer, for example, a quaternary ammonium hydroxide solution, for example, tetra methyl ammonium hydroxide (TMAH).

A variety of polymers may be employed in the topcoat compositions of the invention, including polymers comprising polymerized acrylate groups, polyesters, and other repeat units and/or polymer backbone structures such as provided by, for example, poly(alkylene oxide), poly(meth) acrylic acid, poly(meth)acrylamides, polymerized aromatic (meth)acrylates, and polymerized vinyl aromatic monomers. Typically, the polymers each include at least two differing repeat units. The different polymers suitably may be present in varying relative amounts.

The polymers of the topcoat compositions of the invention may contain a variety of repeat units, including, for example, one or more: hydrophobic groups; weak acid groups; strong acid groups; branched optionally substituted alkyl or cycloalkyl groups; fluoroalkyl groups; or polar groups, such as ester, ether, carboxy, or sulfonyl groups. The presence of particular functional groups on the repeat units of the polymers will depend, for example, on the intended functionality of the polymer.

In certain preferred aspects, one or more polymers of the coating composition will comprise one or more groups that are reactive during lithographic processing, for example, one or more photoacid-acid labile groups that can undergo cleavage reactions in the presence of acid and heat, such as acid-labile ester groups (e.g., t-butyl ester groups such as provided by polymerization of t-butyl acrylate or t-butyl-methacrylate, adamantylacrylate) and/or acetal groups such as provided by polymerization of a vinyl ether compound. The presence of such groups can render the associated polymer(s) more soluble in a developer solution, thereby aiding in developability and removal of the topcoat layer during a development process.

The polymers of the topcoat compositions typically have relatively high molecular weights, for example, in excess of about 3000, 4000 or 4500, daltons. One or more polymers of the compositions can have a molecular weight in excess of 6000, 7000, 8000 or 9000 daltons.

The polymers can advantageously be selected to tailor characteristics of the topcoat layer, with each generally serving a particular purpose or function. Such functions include, for example, one or more of photoresist profile adjusting, topcoat surface adjusting, reducing defects and reducing interfacial mixing between the topcoat and photoresist layers.

The matrix polymer may include, for example, one or more repeating units, with two repeating units being typical. The matrix polymer should provide a sufficiently high developer dissolution rate for reducing overall defectivity due, for example, to micro-bridging. The matrix polymer may include, for example, a sulfonamide-containing monomer for enhancing the polymer developer dissolution rate. A typical developer dissolution rate for the matrix polymer is greater than 500 nm/second. The matrix polymers typically are fluorinated for reducing or minimizing interfacial mixing between the topcoat layer and underlying photoresist. One or more repeating unit of the matrix polymer can be fluorinated, for example, with a fluoroalkyl group such as a C1 to C4 fluoroalkyl group, typically fluoromethyl.

Exemplary matrix polymers in accordance with the invention include the following:

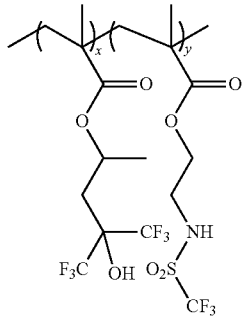

wherein x is from 0 to 90 wt % (weight percent) and y is from 10 to 100 wt %, based on the weight of the polymer. In an exemplary first matrix polymer, x/y is 90/10 wt %;

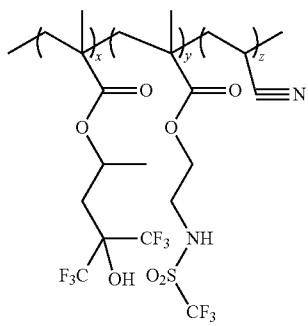

wherein x is from 0 to 85 wt %, y is from 10 to 80 wt % and z is from 5 to 20 wt % based on the weight of the polymer. In an exemplary matrix polymer, x/y/z are 40/45/15 wt %;

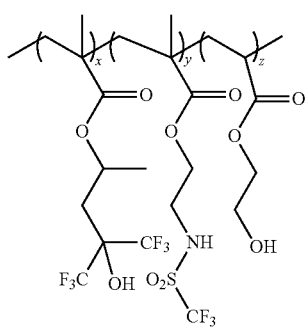

wherein x is from 0 to 85 wt %, y is from 10 to 80 wt % and z is from 5 to 20 wt % based on the weight of the polymer. In an exemplary matrix polymer, x/y/z are 40/45/15 wt %.

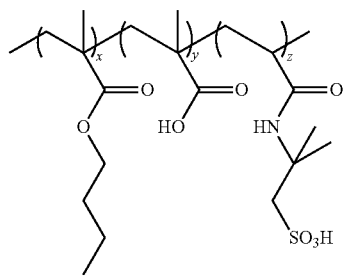

wherein x is from 50 to 85 wt %, y is from 0 to 80 wt % and z is from 0 to 25 wt % based on the weight of the polymer. In an exemplary matrix polymer, x/y/z are 67/28/5 wt %.

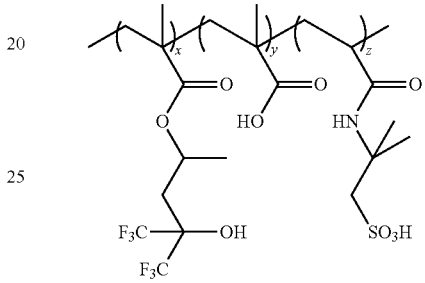

wherein x is from 50 to 85 wt %, y is from 0 to 80 wt % and z is from 0 to 25 wt % based on the weight of the polymer. In an exemplary matrix polymer, x/y/z are 60/30/10 wt %.

A surface active polymer is provided in the topcoat compositions to improve surface properties at the topcoat/immersion fluid interface. In particular, the first additive polymer beneficially can provides desirable surface properties with respect to water, for example, increased immersion fluid receding contact angle at the topcoat/immersion fluid interface, thereby allowing for faster scanning speeds. A layer of the topcoat composition in a dried state has a water receding contact angle of from 75 to 90°. The phrase "in a dried state" means containing 8 wt % or less of solvent, based on the entire composition.

The surface active polymer should have a significantly lower surface energy than and be substantially immiscible with the matrix polymer and other polymers present in the system. In this way, the topcoat layer can be self-segregating, wherein the surface active polymer migrates to the surface of the topcoat layer apart from other polymers during coating. The resulting topcoat layer is thereby rich in the surface active polymer at the topcoat/immersion fluid interface. While the desired surface energy of the additive polymer will depend on the particular matrix polymer and its surface energy, the additive polymer surface energy is typically from 25 to 35 mN/m, preferably from 25 to 30 mN/m. The surface energy of the matrix polymer and the additive polymer is typically from 35 to 60 mN/m. The surface active polymer typically has excellent developability both before and after photolithographic treatment, and typically exhibits a dark field developer dissolution rate, for example, of 1 Å/second or higher.

The surface active polymer is preferably aqueous alkali soluble, typically comprises one or more fluorinated groups and preferably comprises polymerized units of a monomer of the following general formula (II):

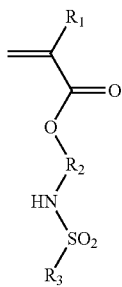

(II)

wherein: $R_1$ is hydrogen or a C1 to C6 alkyl, preferably methyl, or fluoroalkyl group; $R_2$ is a C3 to C8 branched alkylene group, preferably, having two or more branched carbon atoms; and $R_3$ is a C1 to C4 fluoroalkyl group such as fluoromethyl or fluoroethyl.

It is believed that the monomer of general formula (II) can provide improved dark field developer dissolution rate while maintaining a high receding contact angle. Suitable monomers of general formula (II) include, for example,

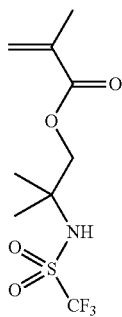 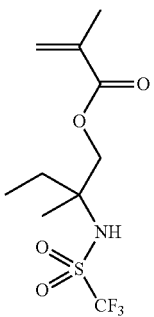 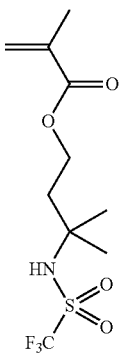

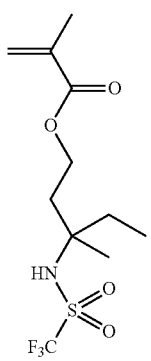 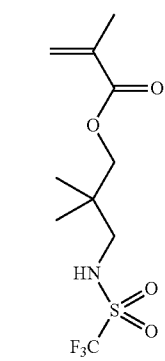 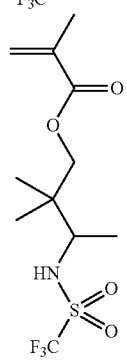

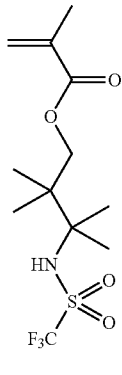 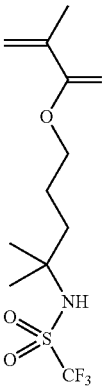 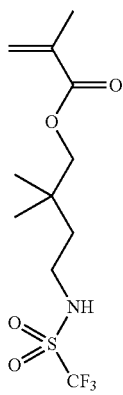

The surface active polymer may further include one or more additional units, for example, fluoroalcohol group-containing units for purposes of enhancing developer solubility and/or units having one or more acid labile functional groups to enhance solubility in a developer solution after processing the photoresist, for example, after exposure to activating radiation and post-exposure baking. The surface active polymer preferably comprises one or more acid-labile groups. Exemplary additional units for use in the surface active additive polymer in accordance with the invention include polymerized units of a monomer of the following general formula (III) and/or of a monomer of the following general formula (IV):

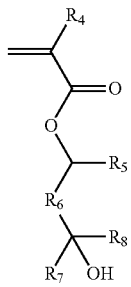

(III)

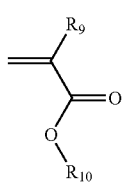

(IV)

wherein: $R_4$ and $R_9$ are independently hydrogen or a C1 to C6 alkyl or fluoroalkyl; $R_5$ is an optionally substituted C3 to C10 cycloalkyl such as cyclohexyl or C3 to C10 branched alkyl group, for example, an isoalkyl group such as isopropyl or isobutyl; $R_6$ is an optionally substituted C1 to C6 alkylene group, preferably methylene or ethylene; $R_7$ and $R_8$ are each independently a C1 to C4 fluoroalkyl group, preferably trifluoromethyl; and $R_{10}$ is an acid or base labile group, preferably having a low activation energy, for example those having a branched alkyl structure. Preferably, the surface active polymer includes polymerized units of monomers of both general formulae (III) and (IV).

It is believed that monomers of general formula (III) allow for enhanced dynamic contact angles, for example, increased receding angle and decreased sliding angle, and for improving developer affinity and solubility. Suitable monomers of general formula (III) include, for example, the following:

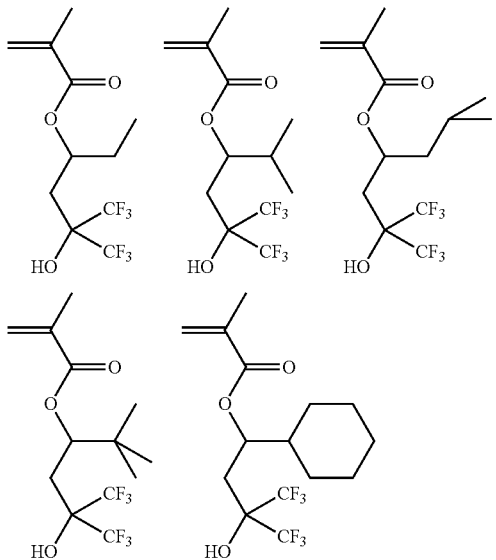

Monomers of general formula (IV) are believed to provide for enhanced developer dissolution in exposed areas due to the acid-labile groups, as well as improved dynamic contact angles. Suitable monomers of general formula (IV) include, for example, the following:

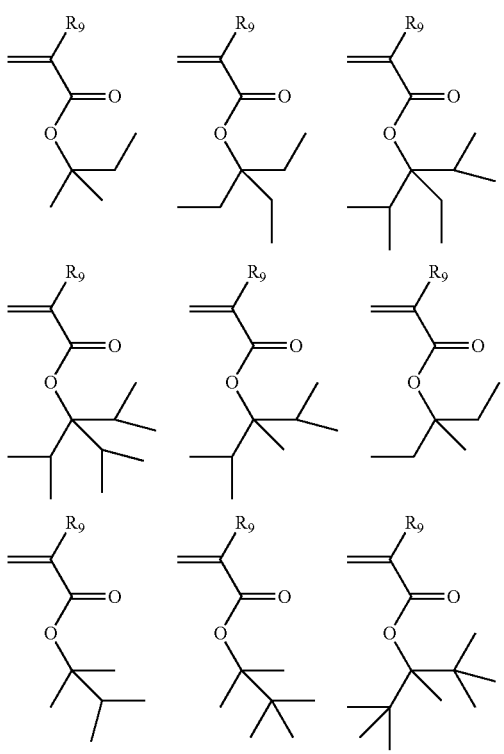

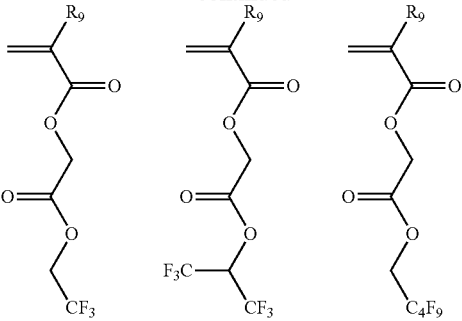

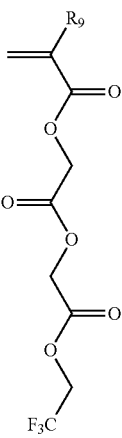

wherein $R_9$ is as defined above with respect to the monomer of general Formula (III).

Exemplary polymers useful in the invention as the surface active polymer include the following:

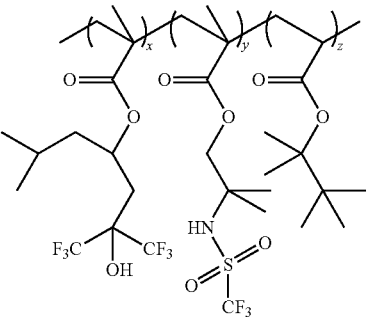

wherein x is from 0 to 89 wt %, y is from 10 to 80 wt % and z is from 5 to 30 wt % based on the weight of the polymer. In exemplary polymers, x/y/z are 50/25/25, 55/25/20 and 65/25/10 wt %.

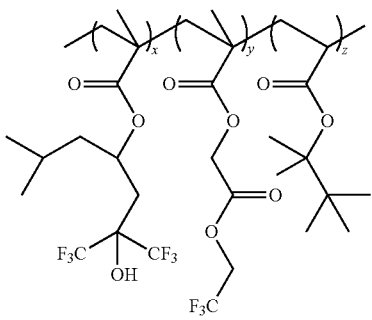

wherein x is from 0 to 90 wt %, y is from 10 to 80 wt % and z is from 0 to 30 wt % based on the weight of the polymer. In exemplary polymers, x/y/z are 50/25/25, 55/25/20 and 65/25/10 wt %.

Optional additional polymers can be present in the topcoat compositions. For example, an additive polymer is preferably provided in addition to the matrix polymer and surface active polymer, typically for purposes of tuning the resist feature profile and for controlling resist top loss. The additive polymer typically includes one or more strong acid functional groups, for example, a sulfonic acid group. The additive polymer should be miscible with the matrix polymer while, as discussed above, generally immiscible with the surface active polymer.

Exemplary additive polymers useful in the invention include the following:

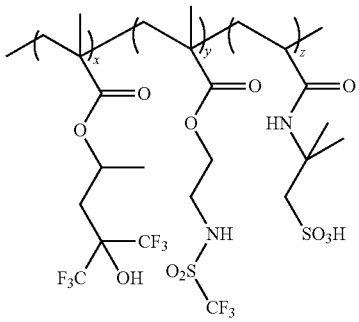

wherein x is from 0 to 89 wt %, y is from 10 to 99 wt % and z is from 1 to 5 wt % based on the weight of the polymer. In an exemplary polymer, x/y/z are 10/85/5 wt %;

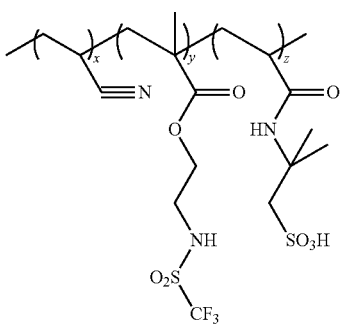

wherein x is from 5 to 20 wt %, y is from 75 to 94 wt % and z is from 1 to 5 wt % based on the weight of the polymer. In an exemplary polymer, x/y/z are 15/80/5 wt %;

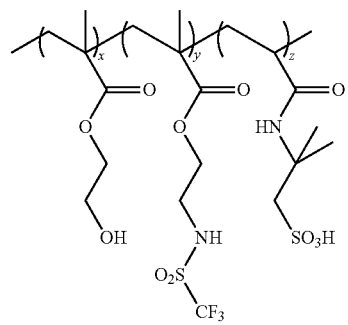

wherein x is from 5 to 20 wt %, y is from 75 to 94 wt % and z is from 1 to 5 wt % based on the weight of the polymer;

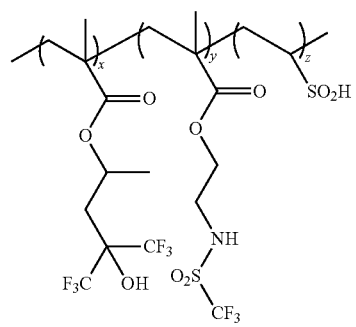

wherein x is from 0 to 89 wt %, y is from 10 to 99 wt % and z is from 1 to 5 wt % based on the weight of the polymer. In an exemplary polymer, x/y/z are 10/87/3 wt %;

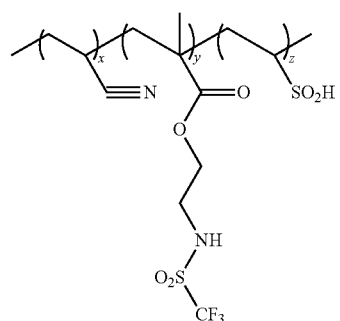

wherein x is from 5 to 20 wt %, y is from 75 to 94 wt % and z is from 1 to 5 wt % based on the weight of the polymer. In an exemplary polymer, x/y/z are 15/82/3 wt %; and

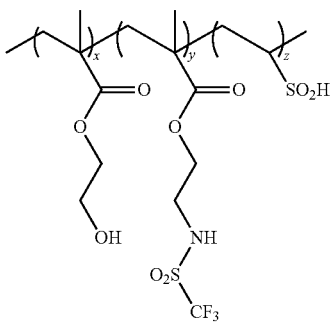

wherein x is from 5 to 20 wt %, y is from 75 to 94 wt % and z is from 1 to 5 wt % based on the weight of the polymer. In an exemplary polymer, x/y/z are 10/87/3 wt %.

Typical solvent materials to formulate and cast a topcoat composition are any which dissolve or disperse the components of the topcoat layer composition but do not appreciably dissolve an underlying photoresist layer. The solvent system of the topcoat composition comprises a first organic solvent represented by the following formula (I), a second organic solvent, and one or more optional additional solvents, wherein in formula (I) R1 and R2 are alkyl groups of 3-8 carbons and the total number of carbons of R1 and R2 is greater than 6:

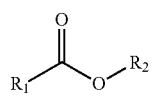  (I)

Suitable first organic solvent includes, but are not limited to, propyl pentanoate, isopropyl pentanoate, isopropyl 3-methylbutanoate, isopropyl 2-methylbutanoate, isopropyl pivalate, isobutyl isobutyrate, 2-methylbutyl isobutyrate, 2-methylbutyl 2-methylbutanoate, 2-methylbutyl 2-methylhexanoate, 2-methylbutyl heptanoate, hexyl heptanoate, n-butyl n-butyrate; isoamyl n-butyrate; isoamyl isovalerate. The first solvent is typically present in the composition in an amount of greater than 1 wt %, preferably from 1 to 50 wt %, more preferably from 10 to 40 wt % and most preferably from 20 to 30 wt %, based on the solvent system.

The second solvent includes C4 to C10 monovalent alcohol, such as n-butanol, isobutanol, 2-methyl-1-butanol, isopentanol, 2,3-dimethyl-1-butanol, 4-methyl-2-pentanol, isohexanol and isoheptanol, isomers thereof and mixtures thereof. The second solvent is typically present in an amount of from 30 to 80 wt % based on the solvent system.

The additive solvent is present to facilitate phase separation between the phase segregation polymer and other polymer(s) in the topcoat composition to facilitate a self-segregating topcoat structure. In addition, the higher boiling point additive solvent can reduce the tip drying effect during coating. It is typical for the additive solvent to have a higher boiling point than the other components of the solvent system. While the desired boiling point of the additive solvent will depend on the other components of the solvent system, a boiling point of from 170 to 200° C. such as about 190° C. is typical. Suitable additive solvents include, for example, hydroxy alkyl ethers, such as those of the formula (V):

R1-OR2-OR3-OH  (V)

wherein R1 is an optionally substituted C1 to C2 alkyl group and R2 and R3 are independently chosen from optionally substituted C2 to C4 alkyl groups, and mixtures of such hydroxy alkyl ethers including isomeric mixtures. Exemplary hydroxy alkyl ethers include dialkyl glycol mono-alkyl ethers and isomers thereof, for example, diethylene glycol monomethyl ether, dipropylene glycol monomethyl ether, isomers thereof and mixtures thereof. The additive solvent is typically present in an amount of from 0.1 to 15 wt % based on the solvent system.

The topcoat compositions of the invention may comprise one or more other optional components, for example, an acid generator compound such as a photoacid generator (PAG) compound. Suitable photoacid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

If employed, the one or more acid generator may be utilized in relatively small amounts in a topcoat composition, for example, 0.1 to 8 wt % of the total of the dry components of the composition (all components except solvent carrier), such as about 2 wt % of the total dry components. Such use of one or more acid generator compounds can favorably impact lithographic performance, particularly resolution, of the developed image patterned in an underlying resist layer.

When used in immersion lithography, preferred topcoat layer compositions will have a refractive index between that of the immersion fluid and that of the photoresist at the target exposure wavelength. Preferred topcoat composition layers will have an index of refraction of 1.4 or greater, preferably 1.47 or greater, at 193 nm. For any particular system, the index of refraction can be tuned by changing the composition of one or more polymers of the topcoat composition, including by altering the ratio of components of a polymer blend, or composition of any of the polymer(s) of a topcoat composition. For instance, increasing the amount of organic content in a topcoat layer composition can provided increased refractive index of the layer.

The topcoat compositions of the invention may be suitably prepared by admixture of the polymers into one or more polar solvents such as those identified above or alternatively one or more non-polar solvents such as the aliphatic and aromatic hydrocarbons identified above. The viscosity of the entire composition is typically from 1.5 to 2 centipoise (cp).

Photoresist Compositions

Photoresist compositions useful in the invention include chemically-amplified photoresist compositions comprising a matrix polymer that is acid-sensitive, meaning that as part of a layer of the photoresist composition, the polymer and composition layer undergo a change in solubility in an organic developer as a result of reaction with acid generated by a photoacid generator following softbake, exposure to activating radiation and post exposure bake. The resist formulation can be positive-acting or negative-acting, but is typically positive-acting. In positive-type photoresists, the change in solubility is typically brought about when acid-labile groups such as photoacid-labile ester or acetal groups in the matrix polymer undergo a photoacid-promoted deprotection reaction on exposure to activating radiation and heat treatment. Suitable photoresist compositions useful for the invention are commercially available For imaging at sub-200 nm wavelengths such as 193 nm, the matrix polymer is typically substantially free (e.g., less than 15 mole %) of phenyl, benzyl or other aromatic groups where such groups are highly absorbing of the radiation. Suitable polymers that are substantially or completely free of aromatic groups are disclosed in European application EP930542A1 and U.S. Pat. Nos. 6,692,888 and 6,680,159, all of the Shipley Company. Preferable acid labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer.

Suitable matrix polymers further include polymers that contain (alkyl)acrylate units, preferably including acid-labile (alkyl)acrylate units, such as t-butyl acrylate, t-butyl methacrylate, methyladamantyl acrylate, methyl adamantyl methacrylate, ethylfenchyl acrylate, ethylfenchyl methacrylate, and the like, and other non-cyclic alkyl and alicyclic (alkyl)acrylates. Such polymers have been described, for example, in U.S. Pat. No. 6,057,083, European Published Applications EP01008913A1 and EP00930542A1, and U.S. Pat. No. 6,136,501.

Other suitable matrix polymers include, for example, those which contain polymerized units of a non-aromatic cyclic olefin (endocyclic double bond) such as an optionally substituted norbornene, for example, polymers described in U.S. Pat. Nos. 5,843,624 and 6,048,664.

Still other suitable matrix polymers include polymers that contain polymerized anhydride units, particularly polymerized maleic anhydride and/or itaconic anhydride units, such as disclosed in European Published Application EP01008913A1 and U.S. Pat. No. 6,048,662.

Also suitable as the matrix polymer is a resin that contains repeat units that contain a hetero atom, particularly oxygen and/or sulfur (but other than an anhydride, i.e., the unit does not contain a keto ring atom). The heteroalicyclic unit can be fused to the polymer backbone, and can comprise a fused carbon alicyclic unit such as provided by polymerization of a norbornene group and/or an anhydride unit such as provided by polymerization of a maleic anhydride or itaconic anhydride. Such polymers are disclosed in PCT/US01/14914 and U.S. Pat. No. 6,306,554. Other suitable heteroatom group containing matrix polymers include polymers that contain polymerized carbocyclic aryl units substituted with one or more hetero-atom (e.g., oxygen or sulfur) containing groups, for example, hydroxy naphthyl groups, such as disclosed in U.S. Pat. No. 7,244,542.

Blends of two or more of the above-described matrix polymers can suitably be used in the photoresist compositions.

Suitable matrix polymers for use in the photoresist compositions are commercially available and can be readily made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight $M_w$ of the matrix polymer is typically less than 100,000, for example, from 5000 to 100,000, more typically from 5000 to 15,000.

The photoresist composition further comprises a photoactive component such as a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials.

Suitable PAGs are known in the art of chemically amplified photoresists and include, for example, those described above with respect to the topcoat composition.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can also include other optional materials. For example, the compositions can include one or more of actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

A preferred optional additive of the resist compositions is an added base. Suitable bases are known in the art. The added base is suitably used in relatively small amounts, for example, from 0.01 to 5 wt %, preferably from 0.1 to 2 wt %, based on total solids of the photoresist composition.

The photoresists can be prepared following known procedures. For example, the resists can be prepared as coating compositions by dissolving the components of the photoresist in a suitable solvent, for example, one or more of: a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

Lithographic Processing

Liquid photoresist compositions can be applied to a substrate such as by spin coating, dipping, roller coating or other conventional coating technique, with spin coating being typical. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in accordance with the invention are suitably applied to substrates conventionally used in processes involving coating with photoresists. For example, the composition may be applied over silicon wafers or silicon wafers coated with one or more layers to be patterned, for example, one or more of metal, semiconductor and dielectric layers. Aluminum-aluminum oxide, gallium arsenide, ceramic, quartz, copper, glass substrates and the like may also be suitably employed. Photoresists also may be suitably applied over an antireflective layer.

A topcoat composition of the invention can be applied over the photoresist composition by any suitable method such as described above with reference to the photoresist compositions, with spin coating being typical.

Following coating of the photoresist onto a surface, it may be dried by heating to remove the solvent until typically the photoresist coating is tack free, or as discussed above, the photoresist layer may be dried after the topcoat layer composition has been applied and the solvent from both the photoresist composition and topcoat composition layers substantially removed in a single thermal treatment step.

The photoresist layer with topcoat composition layer is then exposed to patterned radiation activating for the photoactive component of the photoresist. In an immersion lithography system, the space between the exposure tool (particularly the projection lens) and the photoresist coated substrate is occupied by an immersion fluid, such as water optionally mixed with one or more additives such as cesium sulfate which can provide a fluid of enhanced refractive index. Typically, the immersion fluid (e.g., water) has been treated to avoid bubbles, for example, degassing the water to avoid nanobubbles.

During the exposure step (whether immersion where fluid is interposed, or non-immersion where such fluid is not interposed), the photoresist composition layer is exposed to patterned activating radiation with the exposure energy typically ranging from about 1 to 100 mJ/cm$^2$, dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component, for example, producing photoacid from a photoacid generator compound.

As discussed above, photoresist compositions may be photoactivated by a short exposure wavelength, particularly a sub-300 and sub-200 nm exposure wavelength, with 248 nm and 193 nm being particularly preferred exposure wavelengths, as well as EUV and 157 nm. Following exposure, the film layer of the composition is typically baked at a temperature ranging from about 70° C. to about 160° C.

Thereafter, the film is developed, typically by treatment with an aqueous base developer chosen from quaternary ammonium hydroxide solutions such as a tetra-alkyl ammonium hydroxide solutions; amine solutions, typically a 0.26 N tetramethylammonium hydroxide such as ethyl amine, n-propyl amine, diethyl amine, di-n-propyl amine, triethyl amine, or methyldiethyl amine; alcohol amines such as diethanol amine or triethanol amine; and cyclic amines such as pyrrole or pyridine. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, for example, the manufacture of silicon dioxide wafers, suitable etchants include a gas etchant such as a halogen plasma etchant such as a chlorine- or fluorine-based etchant such a Cl$_2$ or CF$_4$/CHF$_3$ etchant applied as a plasma stream. After such processing, resist may be removed from the processed substrate using known stripping procedures.

The following non-limiting examples are illustrative of the invention.

EXAMPLES

The following monomers were used in the following examples for matrix polymer, surface active polymer and additive polymer synthesis. Monomer ratios are on a weight percentage (wt %) basis of the polymer.

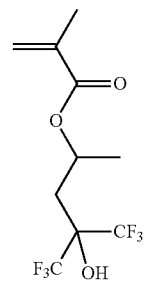

M1

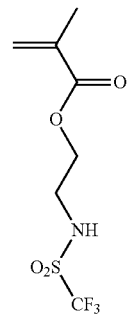

M2

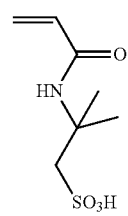

M3

-continued

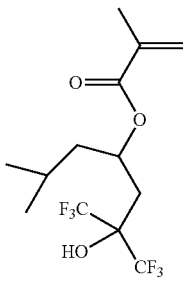
M5

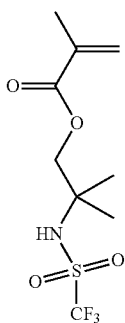
M6

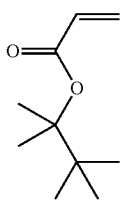
M7

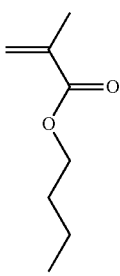
M8

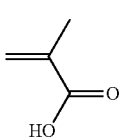
M9

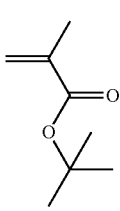

-continued

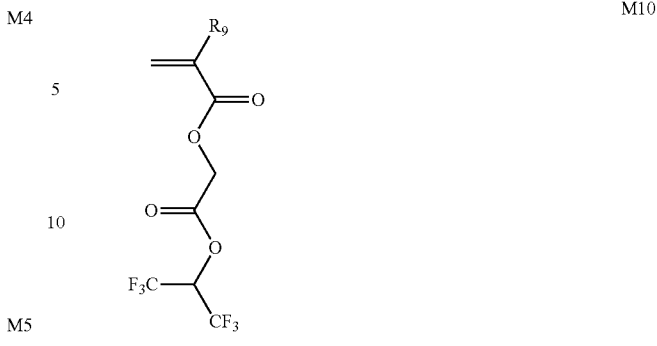
M10

Polymer Synthesis

Matrix Polymer Synthesis

A monomer feed solution was prepared by combining 118.44 g 4-methyl-2-pentanol (4M2P), 78.98 g monomer M1 and 8.78 g monomer M2 in a container and agitating the mixture to dissolve the two monomers. An initiator feed solution was prepared by combining 2.63 g Vazo™ 67 free radical initiator (E. I. du Pont de Nemours and Company) and 85.06 g 4M2P in a suitable container and agitating the mixture to dissolve the initiator. 206.13 g 4M2P was introduced into a reaction vessel and the vessel was purged with nitrogen gas for 30 minutes. The reaction vessel was next heated to 97° C. with agitation. Introduction of the monomer feed solution and initiator feed solution into the reaction vessel was simultaneously started. The monomer feed solution was fed over a period of 2 hours and the initiator feed solution over a period of 3 hours. The reaction vessel was maintained at 97° C. for an additional 2 hours with agitation, and then allowed to cool to room temperature. PM1 was thereby formed. The weight average molecular weight (Mw) of the copolymer was 9,359 Daltons.

Polymer PM2 was synthesized employing a procedure similar to that used for PM1

Surface Active Polymer Synthesis

A monomer feed solution was prepared by combining 4125.0 g monomer M4, 1875.0 g monomer M5, 1500.0 g monomer M6 and 1052.9 g Propylene Glycol Monomethyl Ether Acetate (PGMEA) in a container. The mixture was agitated to dissolve the monomers. An initiator feed solution was prepared by combining 269.7 g Wako V-601 initiator and 2427.4 PGMEA in a container. The mixture was agitated to dissolve the initiator. 3750.0 g PGMEA was introduced into a reaction vessel and the vessel was purged with nitrogen gas for 30 minutes. The reaction vessel was next heated to 99° C. with agitation. Introduction of the monomer feed solution and initiator feed solution into the reaction vessel was simultaneously started and continued for a period of 2 hours. The reaction vessel was maintained at 99° C. for an additional 2 hours. The reaction mixture was then allowed to cool to room temperature. PS1 was thereby formed. The weight average molecular weight (Mw) of the copolymer was 11,905 Daltons.

Additive Polymer Synthesis 49.22 g monomer M3 and 49.22 g DI water were combined in a container. The mixture was agitated to dissolve monomer M3. A monomer feed solution was prepared by combining 935.15 g monomer M2, 98.44 g monomer M3 solution and 842.94 g PGME in a container and agitate the mixture to dissolve monomer M2. An initiator feed solution was prepared by combining 14.77 g Vazo™ 67 free radical initiator and 132.89 g PGME in a container, and agitating the mixture to dissolve the initiator. 975.83 g PGME was introduced into a reaction vessel and the vessel was purged with nitrogen gas for 30-60 minutes. The reaction vessel was heated to 97° C. with agitation. Once temperature of the reaction vessel stabilized at 97° C., introduction of the monomer feed solution and initiator feed solution into the reaction vessel was simultaneously started and carried out over a period of 1.5 hours. The reaction vessel was maintained at 97° C. for an additional 4 hours, and was then allowed to cool to 35° C. Vacuum was applied to the reaction vessel to remove the PGME solvent. After removing ~40% of the reaction mixture by vacuum, vacuum was removed and the reaction mixture was allowed to cool to room temperature. The reaction mixture was added to 18 L of DI water over a period of 20 to 30 minutes with agitation in a container to precipitate the polymer out. Agitation was continued for 10 minutes after completion of addition. The resulting polymer slurry was filtered with a Buchner funnel and washed twice, each time with 2 L DI water. The resulting polymer cake was removed and dried with a vacuum dryer for 24 to 48 hours at 40° C. The dried polymer was then dissolved in 4M2P. PA1 was thereby formed. The weight average molecular weight (Mw) of the copolymer was 25,800 Daltons.

Polymer PS2 and PS3 was synthesized employing a procedure similar to that used for PS1.

TABLE 1

| Polymer | M1 | M2 | M3 | M4 | M5 | M6 | M7 | M8 | M9 | M10 | Mw | PDI |
|---|---|---|---|---|---|---|---|---|---|---|---|---|
| PM1 | 90 | 10 | | | | | | | | | 9359 | 1.6 |
| PM2 | | | 5 | | | | 67 | 28 | | | 27200 | 2.3 |
| PA1 | | 95 | 5 | | | | | | | | 25800 | 2.2 |
| PS1 | | | | 55 | 25 | 20 | | | | | 11905 | 1.8 |
| PS2 | | | | | | | | | 53 | 47 | 14824 | 1.9 |
| PS3 | | | | 80 | 20 | | | | | | 12023 | 1.8 |

Topcoat compositions of the invention were prepared by admixing the components in the amounts set forth in Table 2.

TABLE 2

| Ex. | MP | | AP | | SAP | | PAG | 4M2P | 2HPO | IAE | DPM | IBIB | NBNB | IANB | IAIV |
|---|---|---|---|---|---|---|---|---|---|---|---|---|---|---|---|
| Comp. 1 | PM1 | 1.34 | PA1 | 0.53 | PS1 | 0.09 | | 51.25 | | 46.79 | | | | | |
| Comp. 2 | PM1 | 1.71 | PA1 | | PS1 | 0.07 | | 51.34 | | 46.88 | | | | | |
| Comp. 3 | PM1 | 1.24 | PA1 | 0.49 | PS1 | 0.08 | 0.17 | 98.03 | | | | | | | |
| 1 | PM1 | 1.71 | PA1 | 0.68 | PS1 | 0.11 | | 65.13 | | | 4.47 | 27.91 | | | |
| 2 | PM1 | 2.17 | PA1 | | PS1 | 0.08 | | 65.29 | | | 4.48 | 27.98 | | | |
| 3 | PM1 | 1.24 | PA1 | 0.49 | PS1 | 0.08 | 0.17 | 65.48 | | | 4.49 | 28.06 | | | |
| 4 | PM2 | 1.21 | | | PS2 | 0.16 | 0.07 | 63.67 | | | 4.18 | 30.72 | | | |
| 5 | PM2 | 1.21 | | | PS2 | 0.16 | 0.07 | 63.67 | | | 4.18 | | 30.72 | | |
| 6 | PM2 | 1.21 | | | PS2 | 0.16 | | 63.71 | | | 4.18 | | | 30.74 | |
| 7 | PM2 | 1.21 | | | PS2 | 0.16 | 0.07 | 63.67 | | | 4.18 | | | | 30.72 |
| 8 | PM1 | 1.09 | PA1 | 0.73 | PS3 | 0.25 | | 58.35 | | | 5.71 | 33.88 | | | |
| 9 | PM2 | 1.20 | | | PS1 | 0.16 | 0.01 | 59.10 | | | 5.00 | 34.54 | | | |
| 10 | PM2 | 1.19 | | | PS2 | 0.16 | 0.01 | | 63.14 | | 4.77 | 30.73 | | | |

MP = Matrix Polymer; SAP = Surface Active Polymer; AP = Additive Polymer; PAG = PAG; 4M2P = 4-Methyl-2-Pentanol; 2HPO—2-Heptanol; IAE = Isoamyl Ether; DPM—Dipropylene Glycol Methyl Ether; IBIB—Isobutyl Isobutyrate; NBNB—n-Butyl n-Butyrate; IANB—Isoamyl n-Butyrate; IAIV—Isoamyl Isovalerate. All values in grams (g).

Contact Angle Measurement

The topcoat compositions were coated on EPIC™ 2096 positive photoresist (Rohm and Haas Electronic Materials) to a thickness of 1100 Å and then baked at 90° C. for 60 seconds. Static contact angle (CA), receding CA, advancing CA and sliding angle with respect to DI water were measured for each sample. Static and dynamic contact angles were measured using a KRUSS drop shape analyzer model 100. For dynamic contact angle measurement, the droplet size of DI water was 50 μl (microliter), and the wafer stage tilting rate was 1 unit/sec. Once a water droplet was placed on a test wafer surface, the wafer stage started to tilt immediately. During wafer stage tilting, video of the droplet was taken at a rate of 20 frames per second until the droplet slid away from its original location. Each frame in the video was then analyzed, and the image of the droplet on the frame when the droplet just started to slide was used to determine the dynamic contact angles (receding and advancing) by their corresponding tangent lines. Sliding angle is the wafer stage tilting angle corresponding to the frame when the droplet just started to slide. In static contact angle measurement, water droplet was 2.50 and placed on the test wafer surface without tilting. The contact angle was determined by the tangent lines on both sides of the droplet. The reported static contact angle was the average of the contact angles from left and right sides of the droplet. The results are shown in Table 3.

TABLE 3

| Ex. | Static CA | Receding CA | Advancing CA | Sliding CA |
|---|---|---|---|---|
| Comp. 1 | 86 | 72 | 95 | 19 |
| Comp. 2 | 86 | 71 | 93 | 18 |
| Comp. 3 | 86 | 70 | 92 | 22 |
| 1 | 92 | 78 | 97 | 18 |
| 2 | 92 | 81 | 100 | 16 |
| 3 | 91 | 80 | 97 | 18 |
| 4 | 96 | 85 | 99 | 19 |
| 5 | 96 | 86 | 101 | 18 |
| 6 | 96 | 85 | 101 | 18 |
| 7 | 95 | 81 | 100 | 22 |
| 8 | 95 | 85 | 101 | 19 |
| 9 | 94 | 79 | 99 | 22 |
| 10 | 94 | 78 | 97 | 25 |

Immersion Lithography 300 mm silicon wafers were spin-coated with AR™26N antireflectant (Rohm and Haas Electronic Materials) to form a first bottom antireflective coating (BARC) on a TEL CLEAN TRAC LITHIUS i+ coater/developer. The wafers were baked for 60 seconds at 205° C., yielding a first BARC film thickness of 760 Å. A second BARC layer was formed over the first BARC by spin-coating AR™137 antireflectant (Rohm and Haas Electronic Materials), followed by baking at 205° C. for 60 seconds to generate a 200 Å top BARC layer. EPIC™ 2096 positive photoresist (Rohm and Haas Electronic Materials) was coated on the dual BARC-coated wafers and soft-baked at 120° C. for 60 seconds on a TEL CLEAN TRACK LITHIUS i+ coater/developer to provide a resist layer thickness of 1100 Å. Topcoat compositions of Examples 3, 6 and 7 were coated over the photoresist and soft-baked at 90° C. for 60 seconds on a TEL CLEAN TRACK LITHIUS i+ coater/developer to provide an overcoat thickness of 310 Å. The wafers were exposed through a mask on an ASML TWIN-SCAN XT:1900i immersion scanner using dipole (35-Y) illumination with 1.35 NA, 0.96 outer sigma, 0.76 inner sigma, X polarization and 42 nm 1:1 line space patterns. The exposed wafers were post-exposure baked at 90° C. for 60 seconds and developed with TMAH developer (2.38%) on a TEL CLEAN TRACK™ LITHIUS™ i+ coater/developer to form resist patterns.

What is claimed is:

1. A method of forming a photolithographic pattern, comprising:
   (a) applying a photoresist layer over a substrate;
   (b) applying over the photoresist composition layer a layer of a topcoat composition;
   (c) exposing the photoresist layer to actinic radiation; and
   (d) contacting the exposed photoresist layer with a developer to form a photoresist pattern,
   wherein the topcoat composition comprises 1) a polymer system and 2) a solvent system, the solvent system comprising:
   (i) a first organic solvent that comprises propyl pentanoate, isopropyl pentanoate, isopropyl 3-methylbutanoate, isopropyl 2-methylbutanoate, isopropyl pivalate, isobutyl isobutyrate, 2-methylbutyl isobutyrate, 2-methylbutyl 2-methylbutanoate, 2-methylbutyl 2-methylhexanoate, 2-methylbutyl heptanoate, hexyl heptanoate, n-butyl n-butyrate, isoamyl n-butyrate, or isoamyl isovalerate; and
   (ii) a second organic solvent that comprises n-butanol, isobutanol, 2-methyl-1-butanol, isopentanol, 2,3-dimethyl-1-butanol, 4-methyl-2-pentanol, isohexanol, or isoheptanol, isomers thereof or mixtures thereof,
   wherein the first solvent is present in the composition in an amount of 20 to 30 wt %, based on weight of the solvent system.

2. The method of claim 1 wherein the second solvent is present in the composition in an amount of 30 to 80 wt %, based on weight of the solvent system.

3. A method of forming a photolithographic pattern, comprising:
   (a) applying a photoresist layer over a substrate;
   (b) applying over the photoresist composition layer a layer of a topcoat composition;
   (c) exposing the photoresist layer to actinic radiation; and
   (d) contacting the exposed photoresist layer with a developer to form a photoresist pattern,
   wherein the topcoat composition comprises: 1) a polymer system that comprises three different polymers, wherein the polymer system of the topcoat composition comprises a matrix polymer and a surface active polymer, wherein the matrix polymer is present in the composition in a larger proportion by weight than the surface active polymer, and wherein the surface active polymer has a lower surface energy than a surface energy of the matrix polymers and 2) a solvent system, the solvent system comprising:
   (i) a first organic solvent that comprises n-butyl n-butyrate, isoamyl n-butyrate, or isoamyl isovalerate,
   wherein the first solvent is present in the composition in an amount of 20 to 30 wt %, based on weight of the solvent system; and
   (ii) a second organic solvent is 4-methyl-2-pentanol,
   wherein the second solvent is present in the composition in an amount of 30 to 80 wt %, based on weight of the solvent system.

4. The method of claim 3 wherein the polymer system of the topcoat composition comprises a matrix polymer and a surface active polymer, wherein the matrix polymer is present in the composition in a larger proportion by weight than the surface active polymer, and wherein the surface active polymer has a lower surface energy than a surface energy of the matrix polymer.

* * * * *